(12) United States Patent
Jou et al.

(10) Patent No.: US 8,237,884 B1
(45) Date of Patent: Aug. 7, 2012

(54) ORGANIC LIGHT-EMITTING DIODE DEVICE WITH EFFICIENCY ROLL-UP PROPERTY

(75) Inventors: Jwo-Huei Jou, Taipei (TW); Yi-Shan Wang, Hsinchu (TW)

(73) Assignee: National Tsing Hua University, Hsinchu (TW)

(*) Notice: Subject to any disclaimer, the term of this patent is extended or adjusted under 35 U.S.C. 154(b) by 0 days.

(21) Appl. No.: 13/197,859

(22) Filed: Aug. 4, 2011

(30) Foreign Application Priority Data

Jun. 15, 2011 (TW) .................................. 100120926

(51) Int. Cl.
*G02F 1/1335* (2006.01)

(52) U.S. Cl. ................ 349/61; 349/56; 349/60; 349/62; 313/504; 313/506; 313/512

(58) Field of Classification Search .................... 349/56, 349/60, 61, 62; 313/504, 506, 512
See application file for complete search history.

(56) References Cited

U.S. PATENT DOCUMENTS

| 7,928,439 B2 * | 4/2011 | Jeon et al. ........................ 257/59 |
| 7,965,030 B2 * | 6/2011 | Frank et al. .................... 313/501 |

* cited by examiner

*Primary Examiner* — Jennifer Doan

(57) ABSTRACT

The present invention relates to an organic light-emitting diode device with efficiency roll-up property, comprising: a first conductive layer, a hole injection layer, a host light-emitting layer, a guest light-emitting layer, an electron transportation layer, a second conductive layer, and an electron injection layer, wherein when the guest light-emitting layer is doped in the host light-emitting layer after being appropriately selected and the value of $||\Delta E_{HOMO}|-|\Delta E_{LUMO}||$ approaches to zero, such that the color light emitted by the host light-emitting layer performs the property of current efficiency roll-up.

10 Claims, 17 Drawing Sheets

1

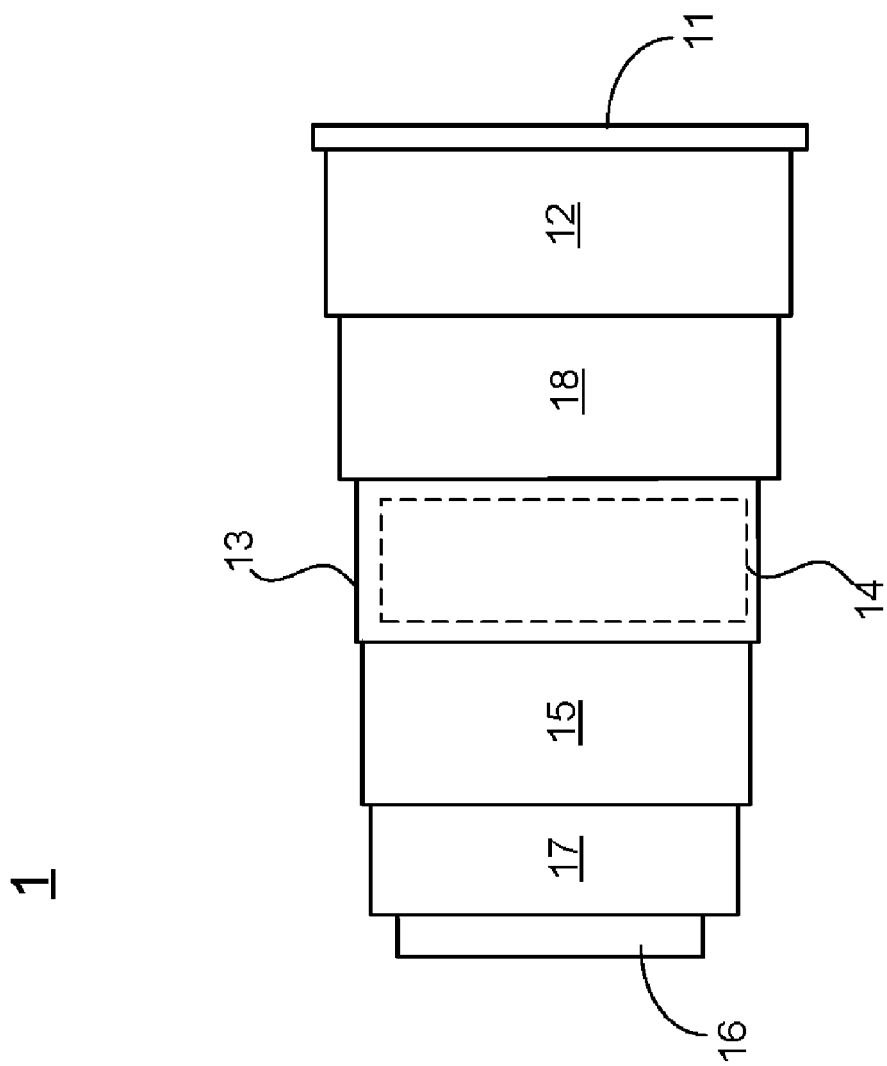

ORGANIC LIGHT-EMITTING DIODE DEVICE WITH EFFICIENCY ROLL-UP PROPERTY

CROSS-REFERENCE TO RELATED APPLICATION

This application claims foreign priority from a Taiwan Patent Application, Ser. No. 100120928, filed on Jun. 15, 2011.

BACKGROUND OF THE INVENTION

1. Field of the Invention

The present invention relates to an organic light-emitting diode (OLED) device, and more particularly to an organic light-emitting diode device with efficiency roll-up property.

2. Description of the Prior Art

An organic light emitting diode (OLED) was invented by C. W. Tang and S. A. VanSlyk et al. of Eastman Kodak Company in 1987 and manufactured by a vacuum evaporation method. A hole transporting material and an electron transporting material (such as $Alq_3$) are respectively deposited on a transparent indium tin oxide (abbreviated as ITO) glass, and then a metal electrode is vapor-deposited thereon to form the self-luminescent OLED apparatus. Due to high brightness, fast response speed, light weight, compactness, true color, no difference in viewing angles, no need of liquid crystal display (LCD) type backlight plates as well as a saving in light sources and low power consumption, it has become a new generation display.

In addition to light-emitting material layers, the conventional OLED device is often added to other intermediate layers, such as an electron transport layer and a hole transport layer, so as to enhance the efficiency of the OLED device. Referring to FIG. 1, which is a structural drawing of a conventional OLED device. As shown in FIG. 1, the conventional OLED device 1' includes a cathode 11', an electron injection layer 12', an electron transport layer 13', a first light-emitting material layer 14', a second light-emitting material layer 15', a hole transport layer 16', a hole injection layer 17', and an anode 18'.

The above-mentioned conventional OLED device 1' is an OLED device with high efficiency. However, referring to FIG. 2, which is a curve diagram of the luminous efficiency of the conventional OLED device 1'. As shown in FIG. 2, when the brightness of the conventional OLED device 1' is higher than 3500 $cd/m^2$, the luminous efficiency of the conventional OLED device 1' is decreased rapidly. Such a phenomenon is called an Efficiency Roll-Off phenomenon of the conventional OLED device 1'.

According to the conventional OLED device has the drawback of the Efficiency Roll-Off, OLED manufacturers have made great efforts to make inventive research thereon and eventually provided an OLED device with mixed light-emitting layer. Please refer to FIG. 3, which illustrates a structural drawing of an OLED device with a mixed light-emitting layer. As shown in FIG. 3, the OLED device 1" with the mixed light-emitting layer includes: a first conductive layer 11", a hole injection layer 12", a hole transportation layer 13". A first light-emitting layer 14", a second light-emitting layer 15", an electron transportation layer 16", an electron injection layer 17", a second conductive layer 18", and a third light-emitting layer 19", wherein the first conductive layer 11" is an Indium Tin Oxid (ITO), used as an anode of the OLED device 1". The hole injection layer 12", the hole transportation layer 13", the first light-emitting layer 14", the third light-emitting layer 19", the second light-emitting layer 15", the electron transportation layer 16", the electron injection layer 17", and the second conductive layer 18" are sequentially formed on the ITO substrate.

In the aforesaid OLED device 1" with the mixed light-emitting layer, the the third light-emitting layer 19" is formed by mixing part of the first light-emitting layer 14" and part of the second light-emitting layer 15", and the thickness of the third light-emitting layer 19" should be less than 10 nm. Please refer to FIG. 4, which illustrates a curve diagram of the luminous efficiency of the OLED device with the mixed light-emitting layer. As shown in FIG. 4, the solid curve with solid triangles represents the luminous efficiency data plot of the prior art OLED device; the dashed curve with hollow circles represents the luminous efficiency data plot of the OLED device 1" with the mixed light-emitting layer. Wherein when the brightness of the OLED devices exceed 3500 $cd/m^2$, the solid curve and the dashed curve begin to decline. However, when the brightness is about 10000 $cd/m^2$, the hollow circles on the dashed curve are higher than the solid triangles on the solid curve. Thus, through the curves shown in FIG. 4, it can understand that the Efficiency Roll-off phenomenon in the high-brightness area of the OLED device 1" with the mixed light-emitting layer is improved greatly compared to the prior art OLED device.

Accordingly, through above descriptions, it is able to know that the OLED device with the mixed light-emitting layer may improved the drawback of the efficiency roll-off existing in the prior art OLED devices. However, the brightness and the luminous efficiency showed by the OLED device with the mixed light-emitting layer are still inadequate for making the OLED devices with the mixed light-emitting layer to replace the LED devices being used as the lighting devices and display devices.

Thus, in view of the conventional OLED device and the OLED devices with the mixed light-emitting layer still have shortcomings and drawbacks, the inventor of the present application has made great efforts to make inventive research thereon and eventually provided an organic light-emitting diode device with efficiency roll-up property.

SUMMARY OF THE INVENTION

The primary objective of the present invention is to provide an organic light-emitting diode device with efficiency roll-up property, in which, it properly selects a guest light-emitting material and dopes the guest light-emitting material into a host light-emitting layer, so as to make the differential value of the energy difference between the host highest occupied molecular orbital energy level ($E_{HOMO,host}$) and guest highest occupied molecular orbital energy level ($E_{HOMO,guest}$) and the energy difference between the host lowest unoccupied molecular orbital energy level ($E_{LUMO,host}$) and the guest lowest unoccupied molecular orbital energy level ($E_{LUMO,guest}$) approach to zero, i.e., the value of $||\Delta E_{HOMO}|-|\Delta E_{LUMO}||$ approaches to zero, such that the color light emitted by the host light-emitting layer can show the property of current efficiency roll-up.

Accordingly, to achieve the primary objective of the present invention, the inventor of the present invention provides an organic light-emitting diode device with efficiency roll-up property, comprising:

a first conductive layer;

a hole injection layer, formed on the first conductive layer;

a host light-emitting layer, formed on the hole injection layer and having a host highest occupied molecular orbital energy level ($E_{HOMO,host}$) and a host lowest unoccupied molecular orbital energy level ($E_{LUMO,host}$);

a guest light-emitting material, properly selected and doped in the host light-emitting layer, wherein the guest light-emitting material has a guest highest occupied molecular orbital energy level ($E_{HOMO,guest}$) and a guest lowest unoccupied molecular orbital energy level ($E_{LUMO,guest}$);

an electron transportation layer, formed on the host light-emitting layer;

an electron injection layer, formed on the electron transportation layer; and a second conductive layer, formed on the electron injection layer;

wherein when a forward bias is applied to the first conductive layer and the second conductive layer, a plurality of holes may be injected into the hole injection layer from the first conductive layer, and a plurality of electrons may be injected into the electron injection layer from the second conductive layer, moreover, a potential difference produced by the forward bias making the electrons and the holes to move, and the moving electrons and the moving holes may recombine in the host light-emitting layer, such that the host light-emitting layer emits a color light;

wherein when the selected guest light-emitting material is doped in the host light-emitting layer and makes the value of $||\Delta E_{HOMO}|-|\Delta E_{LUMO}||$ approach to zero, the color light emitted by the host light-emitting layer shows the property of current efficiency roll-up;

wherein the $\Delta E_{HOMO}$ is defined as the differential value of the host highest occupied molecular orbital energy level ($E_{HOMO,host}$) and guest highest occupied molecular orbital energy level ($E_{HOMO,guest}$), and the $\Delta E_{LUMO}$ is defined as the differential value of the host lowest unoccupied molecular orbital energy level ($E_{LUMO,host}$) and the guest lowest unoccupied molecular orbital energy level ($E_{LUMO,guest}$).

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein:

FIG. 12 is a structural drawing of a second embodiment of the organic light-emitting diode device with efficiency roll-up property according to the present invention.

DETAILED DESCRIPTION OF THE PREFERRED EMBODIMENTS

To more clearly describe an organic light-emitting diode device with efficiency roll-up property according to the present invention, embodiments of the present invention will be described in detail with reference to the attached drawings hereinafter.

Figure 1:
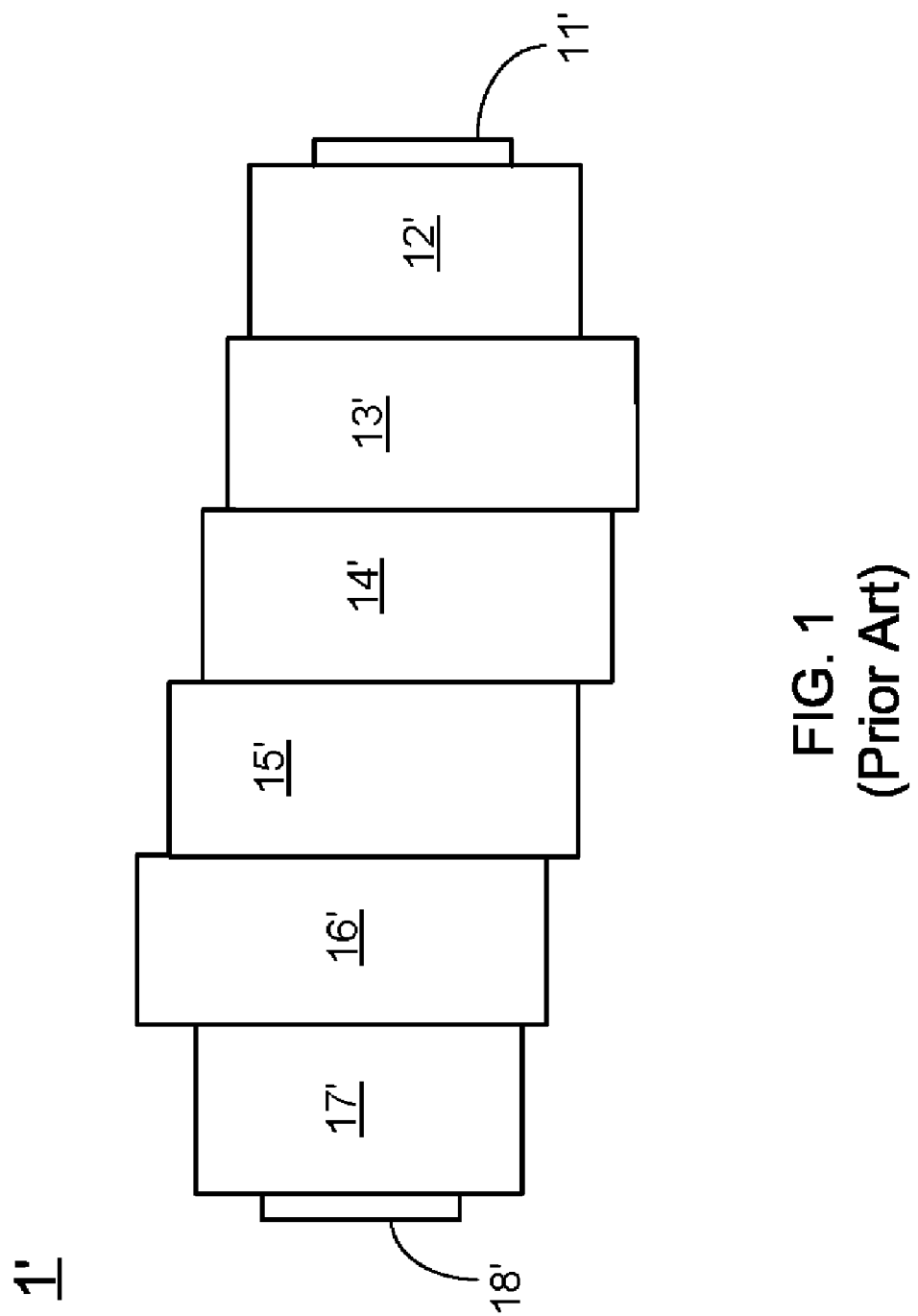
FIG. 1 is a structural drawing of a conventional OLED device.
Figure 2:
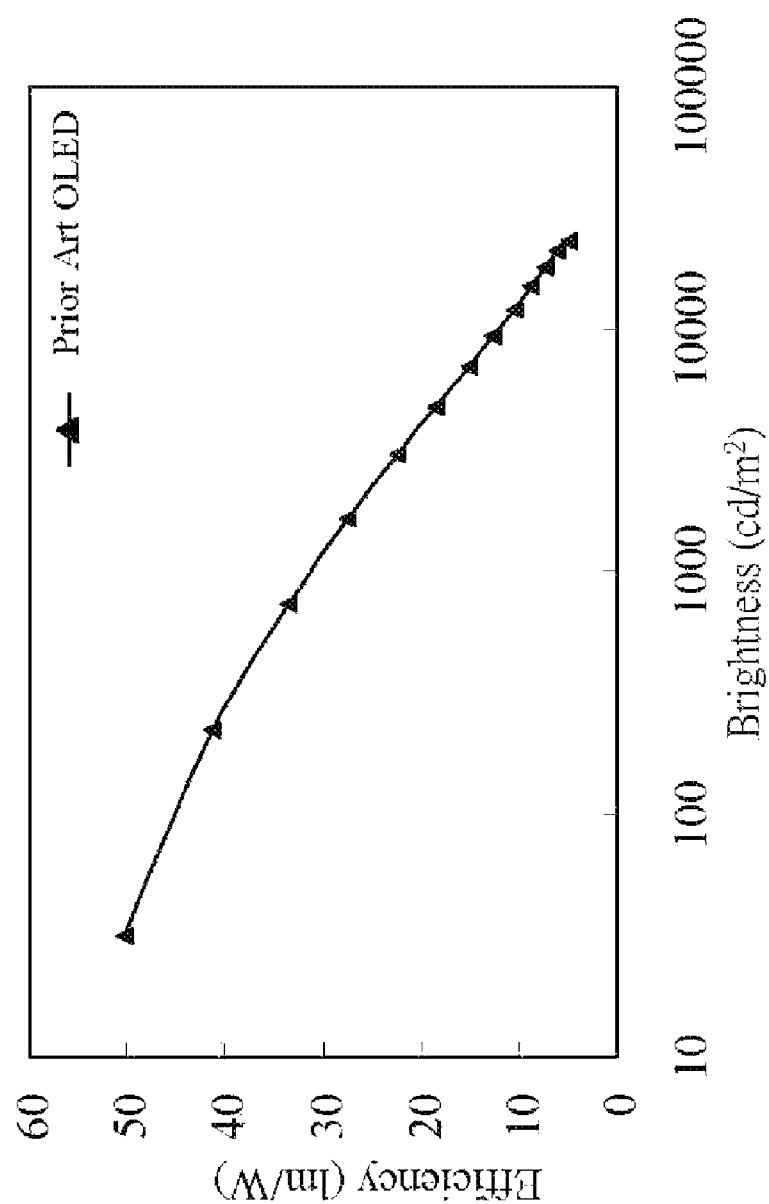
FIG. 2 is a curve diagram of the luminous efficiency of the conventional OLED device.
Figure 3:
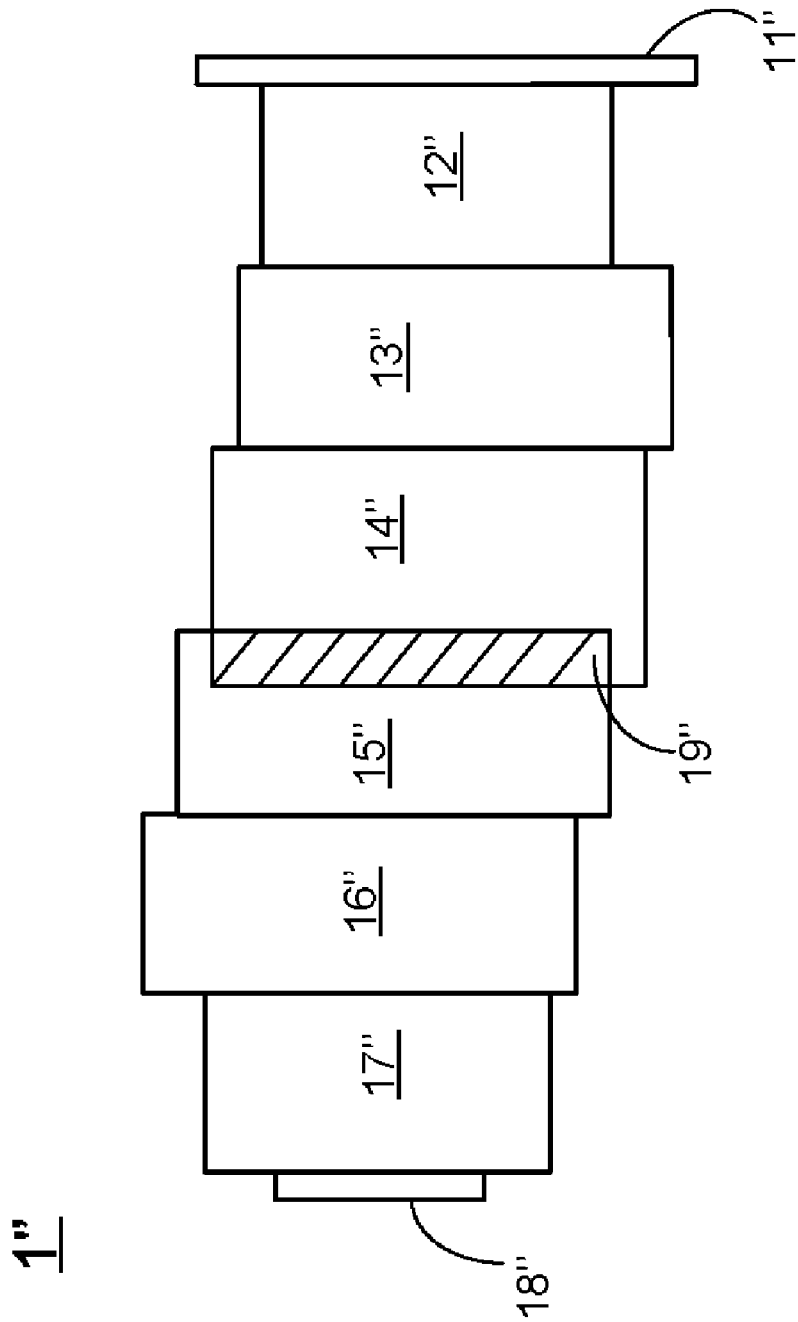
FIG. 3 is a structural drawing of an OLED device with a mixed light-emitting layer.
Figure 4:
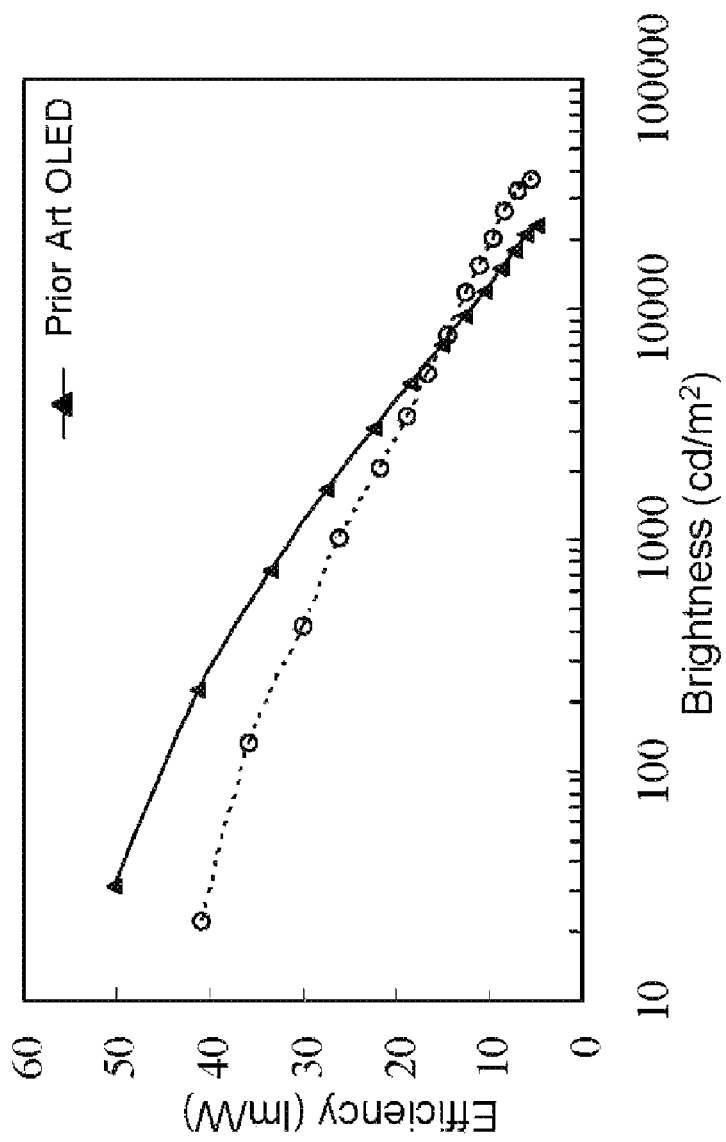
FIG. 4 is a curve diagram of the luminous efficiency of the OLED device with the mixed light-emitting layer.
Figure 5:
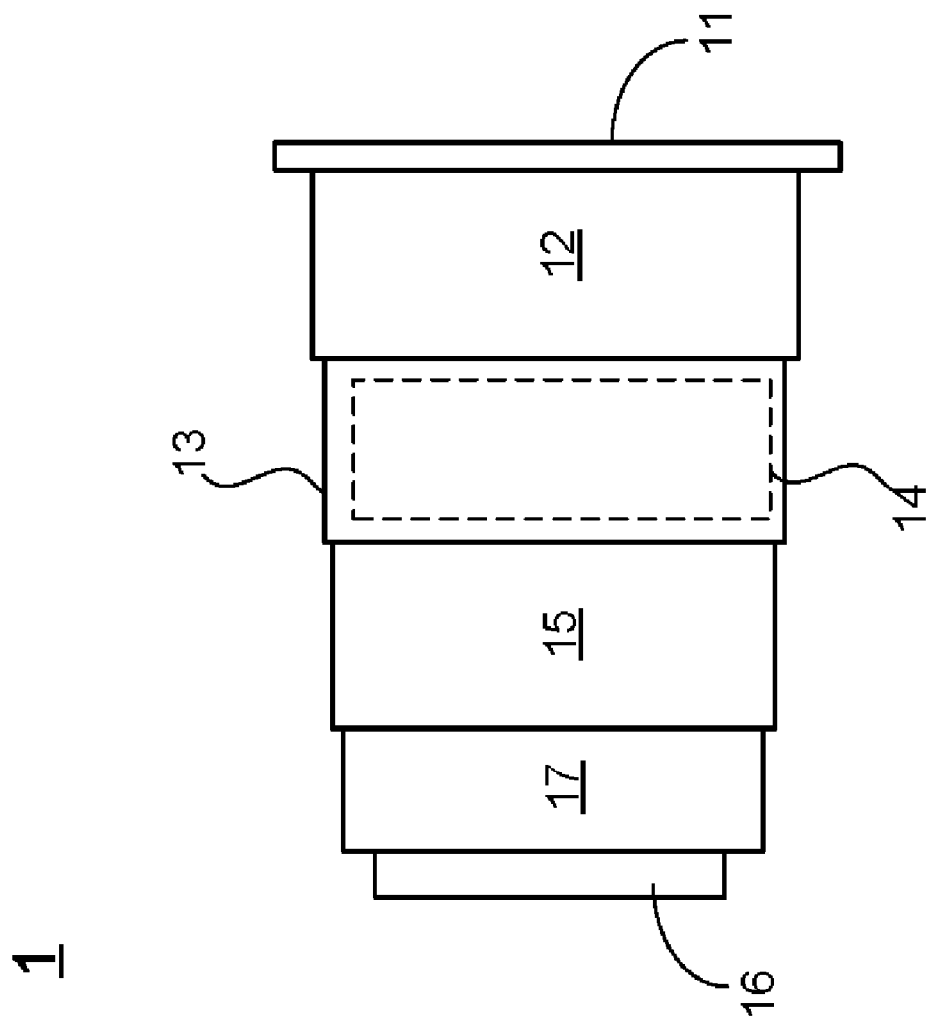
FIG. 5 is a structural drawing of an organic light-emitting diode device with efficiency roll-up property according to the present invention.

Referring to FIG. 5, which illustrates a structural drawing of an organic light-emitting diode device with efficiency roll-up property according to the present invention. As shown in FIG. 5, the organic light-emitting diode device 1 with efficiency roll-up property includes: a first conductive layer 11, a hole injection layer 12, a host light-emitting layer 13, a guest light-emitting material 14, an electron transportation layer 15, an electron injection layer 17, and a second conductive layer 16, wherein the hole injection layer 12 is formed on the first conductive layer 11. The host light-emitting layer 13 is formed on the hole injection layer 12 and has a host highest occupied molecular orbital energy level ($E_{LUMO,host}$) and a host lowest unoccupied molecular orbital energy level ($E_{LUMO,host}$).

Continuously referring to FIG. 5, the guest light-emitting material 14 is properly selected and doped in the host light-emitting layer 13, and has a guest highest occupied molecular orbital energy level ($E_{HOMO,guest}$) and a guest lowest unoccupied molecular orbital energy level ($E_{LUMO,guest}$). Moreover, the electron transportation layer 15 is formed on the host light-emitting layer 13, the electron injection layer 17 is formed on the electron transportation layer 15, and the second conductive layer 16 is formed on the electron injection layer 17. For the organic light-emitting diode device 1 of the present invention, when a forward bias is applied to the first conductive layer 11 and the second conductive layer 16, a plurality of holes may be injected into the hole injection layer 12 from the first conductive layer 11, and a plurality of electrons may be injected into the electron injection layer 17 from the second conductive layer 16, therefore, a potential difference produced by the forward bias would make the electrons and the holes to move, and the moving electrons and the moving holes may recombine in the host light-emitting layer 13, such that the host light-emitting layer 13 emits a color light.

For the organic light-emitting diode device 1 of the present invention, when the selected guest light-emitting material 14 is doped in the host light-emitting layer 13 and makes the value of $\|\Delta E_{HOMO}|-|\Delta E_{LUMO}\|$ approach to zero, the color light emitted by the host light-emitting layer 13 shows the property of current efficiency roll-up. The $\Delta E_{HOMO}$ is defined as the differential value of the host highest occupied molecular orbital energy level ($E_{HOMO,host}$) and guest highest occupied molecular orbital energy level ($E_{HOMO,guest}$) and the $\Delta E_{LUMO}$ is defined as the differential value of the host lowest unoccupied molecular orbital energy level ($E_{LUMO,host}$) and the guest lowest unoccupied molecular orbital energy level ($E_{LUMO,guest}$).

Figure 6A:
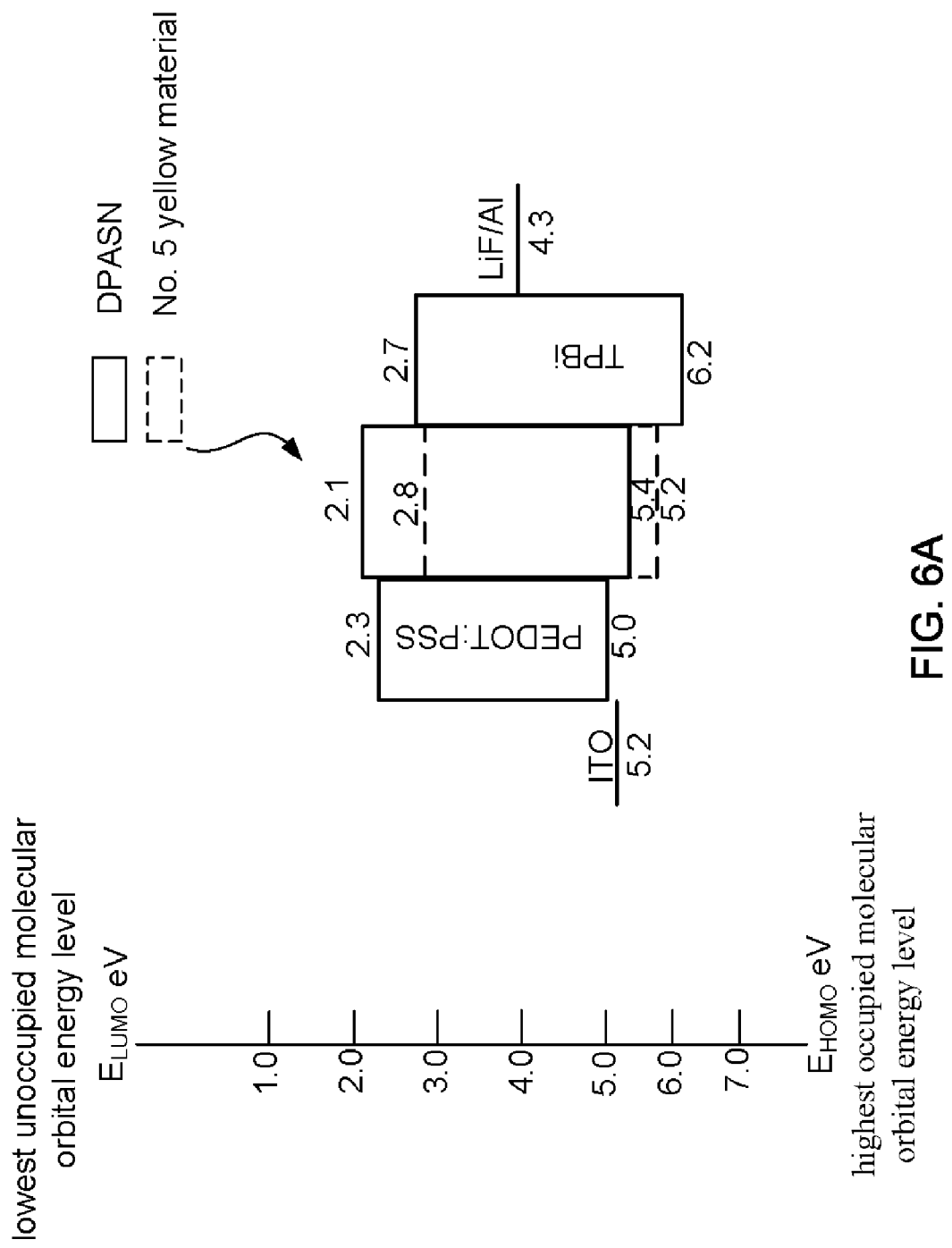
FIG. 6A is an energy level diagram of an organic light-emitting diode device using DPASN as a host light-emitting layer.

In order to prove the characteristics and the effect of the organic light-emitting diode device 1 of the present invention, in follows, it will further describe and introduce that through a variety of experiment data. Firstly, in the experiment, it uses three different host light-emitting materials as the host light-emitting layers of three organic light-emitting diode devices, respectively. Please refer to FIG. 5 again, and simultaneously referring to FIG. 6A, FIG. 6B and FIG. 6C, there are shown the energy level diagrams of the three organic light-emitting diode devices respectively using DPASN, MDP3FL and BANE as the host light-emitting layer thereof. As shown in FIG. 5 and FIG. 6A, in the organic light-emitting diode device 1 using DPASN as the host light-emitting layer, the first conductive layer 11 is an Indium Tin Oxide (ITO), which has an energy level 5.2 eV and is used as an anode. The manufacturing material of the hole injection layer 12 is poly(3,4-ethylene-dioxythiophene):poly-(styrenesulfonate) (PEDOT:PSS), and the highest occupied molecular orbital energy level and the lowest unoccupied molecular orbital energy level of the PEDOT:PSS are 5.0 eV and 2.3 eV, respectively. The manufacturing material of the host light-emitting layer 13 is 2-(N,N-diphenyl-amino)-6-[4-(N,N-diphenylamine)styryl]naphthalene (DPASN), and the highest occupied molecular orbital energy level and the lowest unoccupied molecular orbital energy level of the DPASN are 5.2 eV and 2.1 eV. The manufacturing material of the guest light-emitting material 14 is Spiro-fluorene-dibenzosuberene[d](1,4-bis(4-(N,N-diphenylamine)-phenyl)-quinoxaline) (No. 5 yellow material), and the highest occupied molecular orbital energy level and the lowest unoccupied molecular orbital energy level of the No. 5 yellow material are 5.4 eV and 2.8 eV. The manufacturing material of the electron transportation layer 15 is 1,3,5-tris(N-phenylbenzimidazol-2-yl)benzene (TPBi), and the highest occupied molecular orbital energy level and the lowest unoccupied molecular orbital energy level of the TPBi are 6.2 eV and 2.7 eV. Moreover, the electron injection layer 17 is Lithium Fluoride (LiF), and the second conductive layer 16 is an aluminum (Al) used as a cathode, wherein the effective energy level of the LiF and the Al is 4.3 eV.

Figure 6B:
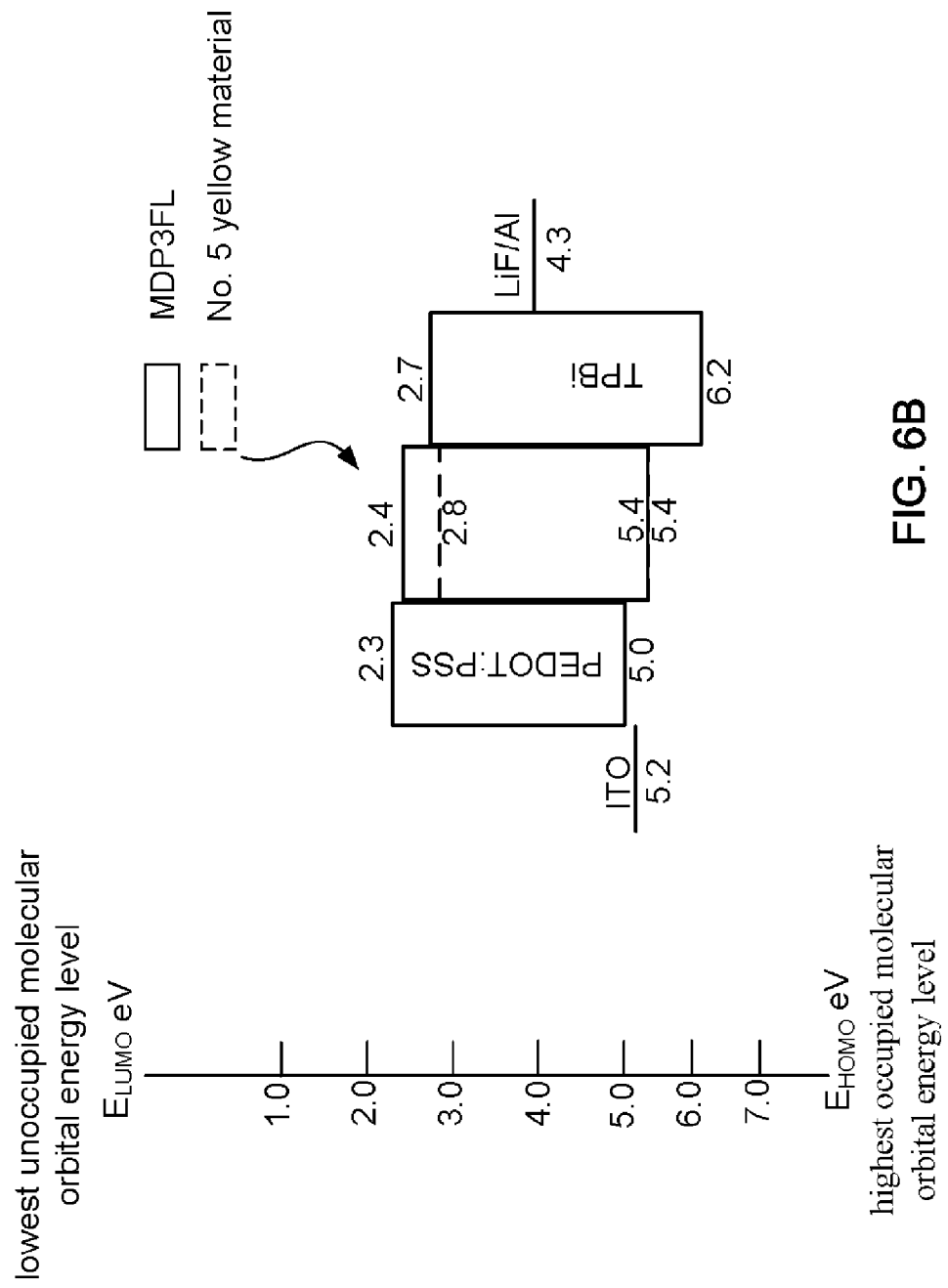
FIG. 6B is an energy level diagram of an organic light-emitting diode device using MDP3FL as a host light-emitting layer.

As shown in FIG. 5 and FIG. 6B, in the organic light-emitting diode device 1 using MDP3FL as the host light-emitting layer, the first conductive layer 11 is the ITO used as the anode. The manufacturing material of the hole injection layer 12 is the PEDOT:PSS. The manufacturing material of the host light-emitting layer 13 is 2,7-bis{2[phenyl(m-tolyl)amino]-9,9-dimethyl-fluorene-7-yl}-9,9-dimethyl-fluorene (MDP3FL), and the highest occupied molecular orbital energy level and the lowest unoccupied molecular orbital energy level of the MDP3FL are 5.4 eV and 2.4 eV, respectively. The manufacturing material of the guest light-emitting material 14, the electron transportation layer 15, the electron injection layer 17, and the second conductive layer 16 are the No. 5 yellow material, the TPBi, the LiF and the Al, respectively.

Figure 6C:
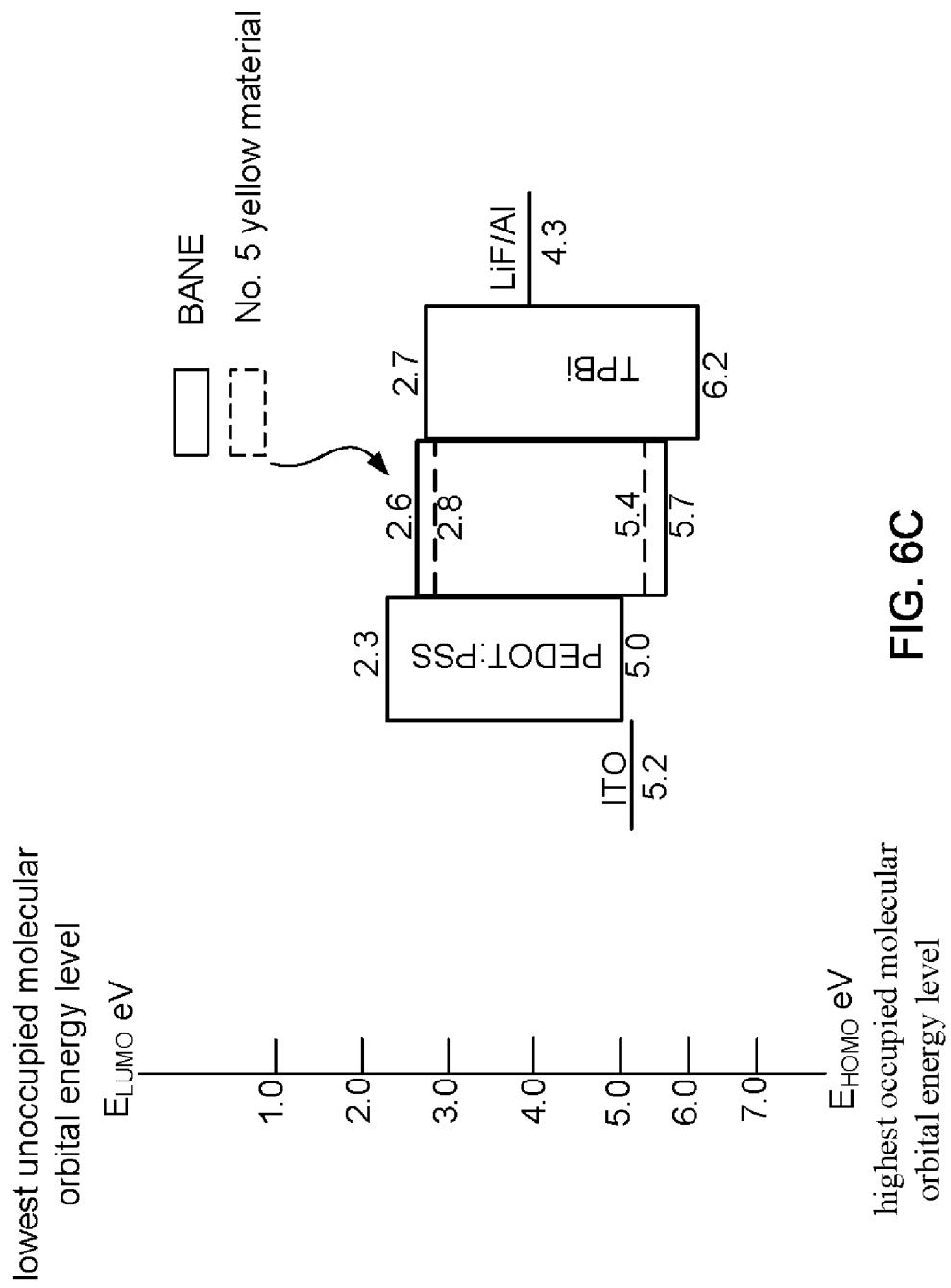
FIG. 6C is an energy level diagram of an organic light-emitting diode device using BANE as a host light-emitting layer.

As shown in FIG. 5 and FIG. 6C, in the organic light-emitting diode device 1 using BANE as the host light-emitting layer, the first conductive layer 11 is the ITO used as the anode. The manufacturing material of the hole injection layer 12 is the PEDOT:PSS. The manufacturing material of the host light-emitting layer 13 is 1-butyl-9,10-naphthalene-anthracene (BANE), and the highest occupied molecular orbital energy level and the lowest unoccupied molecular orbital energy level of the BANE are 5.7 eV and 2.6 eV, respectively. The manufacturing material of the guest light-emitting material 14, the electron transportation layer 15, the electron injection layer 17, and the second conductive layer 16 are the No. 5 yellow material, the TPBi, the LiF and the Al, respectively.

The three different organic light-emitting diode devices shown in FIG. 6A, FIG. 6B and FIG. 6C have the same first conductive layer 11 (i.e., the anode), hole injection layer 12, guest light-emitting material 14, electron transportation layer 15, electron injection layer 17, and second conductive layer 16 (i.e., the cathode); However, the three different organic light-emitting diode devices have three different host light-emitting layers 13, which are DPASN, MDP3FL and BANE.

Figure 7:
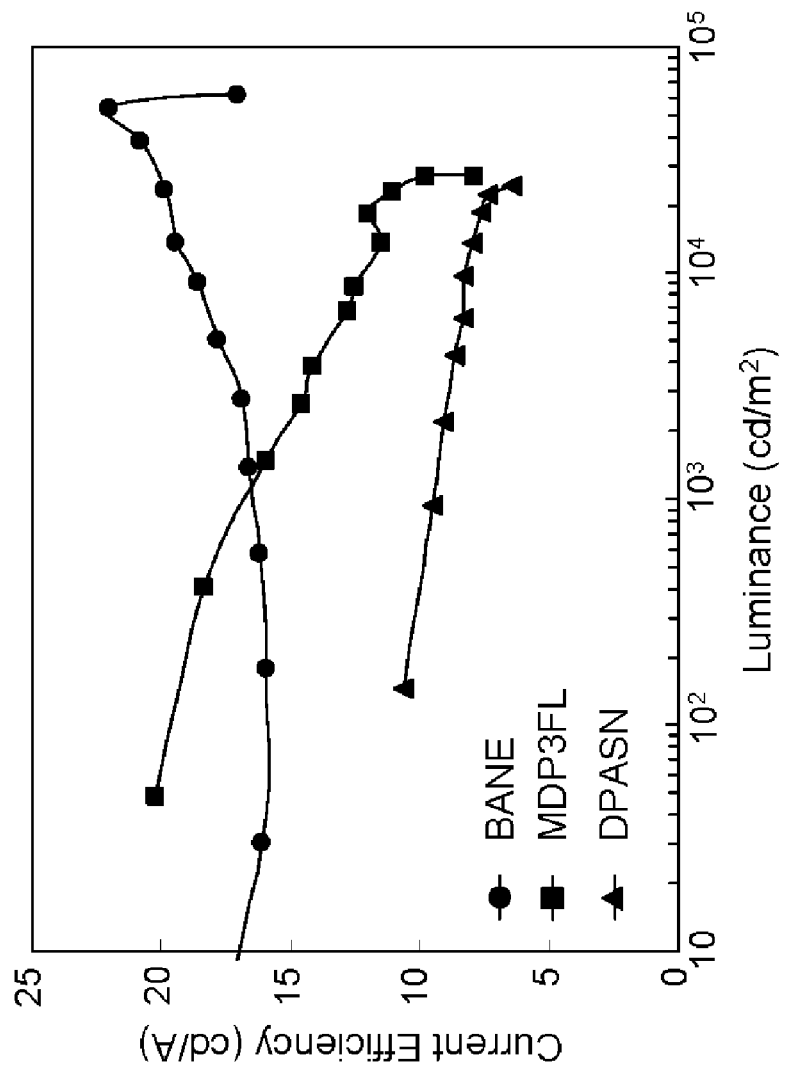
FIG. 7 is a curve diagram of the current efficiency of the three organic light-emitting diode devices.

Referring to FIG. 6A, FIG. 6B and FIG. 6C again, and simultaneously refer to FIG. 7, which illustrates a curve diagram of the current efficiency of the three organic light-emitting diode devices. Through the curve shown in FIG. 7, it is able to know that, in the organic light-emitting diode device using the BANE as the host light-emitting layer, since the highest occupied molecular orbital energy level and the lowest unoccupied molecular orbital energy level of the BANE are 5.7 eV and 2.6 eV and the highest occupied molecular orbital energy level and the lowest unoccupied molecular orbital energy level of the light-emitting material are 5.4 eV and 2.8 eV, the differential value of the host lowest unoccupied molecular orbital energy level ($E_{LUMO,host}$) and guest lowest unoccupied molecular orbital energy level ($E_{LUMO,guest}$), i.e., $\Delta E_{LUMO}=E_{LUMO,host}-E_{LUMO,guest}=2.6-2.8=-0.2$ eV; Besides, $\Delta E_{HOMO}=E_{HOMO,host}-E_{HOMO,guest}=5.7-5.4=0.3$ eV. Therefore, according to the calculated $\Delta E_{LUMO}$ and $\Delta E_{HOMO}$, it can further calculate the value of $\|\Delta E_{HOMO}|-|\Delta E_{LUMO}\|$ is 0.1 eV. Thus, with the incensement of the luminance, the color light emitted by the organic light-emitting diode device using the BANE as the host light-emitting layer shows the property of current efficiency roll-up; On the contrary, the color lights emitted by the organic light-emitting diode device using the MDP3FL as the host light-emitting layer and the organic light-emitting diode device using the DPASN as the host light-emitting layer show the property of current efficiency roll-off.

So that, through above descriptions, it knows that BANE is suitable for being the host light-emitting layer of the organic light-emitting diode device. Furthermore, in the next experiment, it selects three different guest light-emitting materials and dopes the three different guest light-emitting materials into three organic light-emitting diode devices using BANE as host light-emitting layer. Then, the influence on the organic light-emitting diode devices brought by the different guest light-emitting materials will be compared.

Figure 8A:
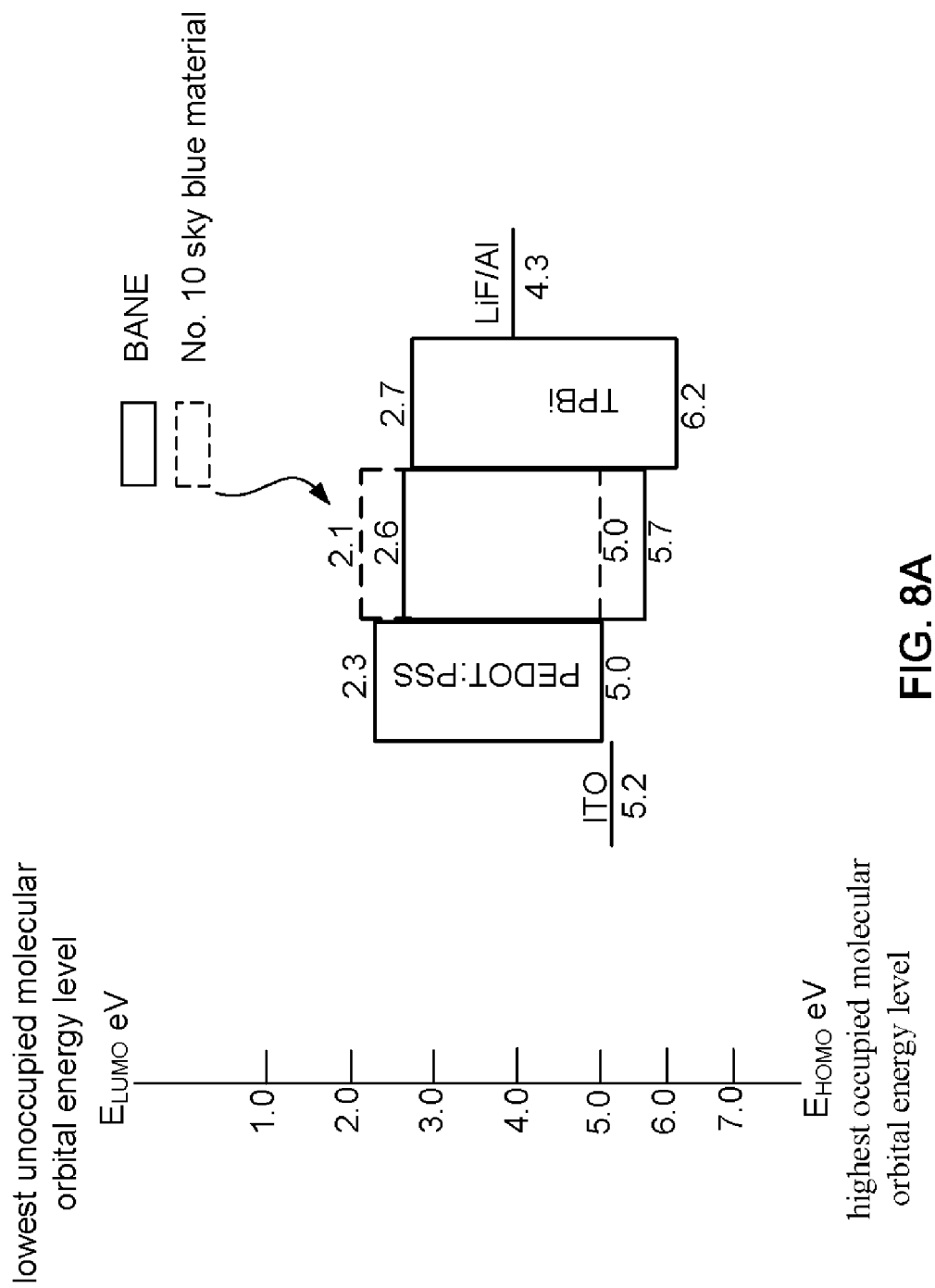
FIG. 8A is an energy level diagram of an organic light-emitting diode device respectively using BANE and No. 10 sky blue material as a host light-emitting layer and a guest light-emitting material.
Figure 8B:
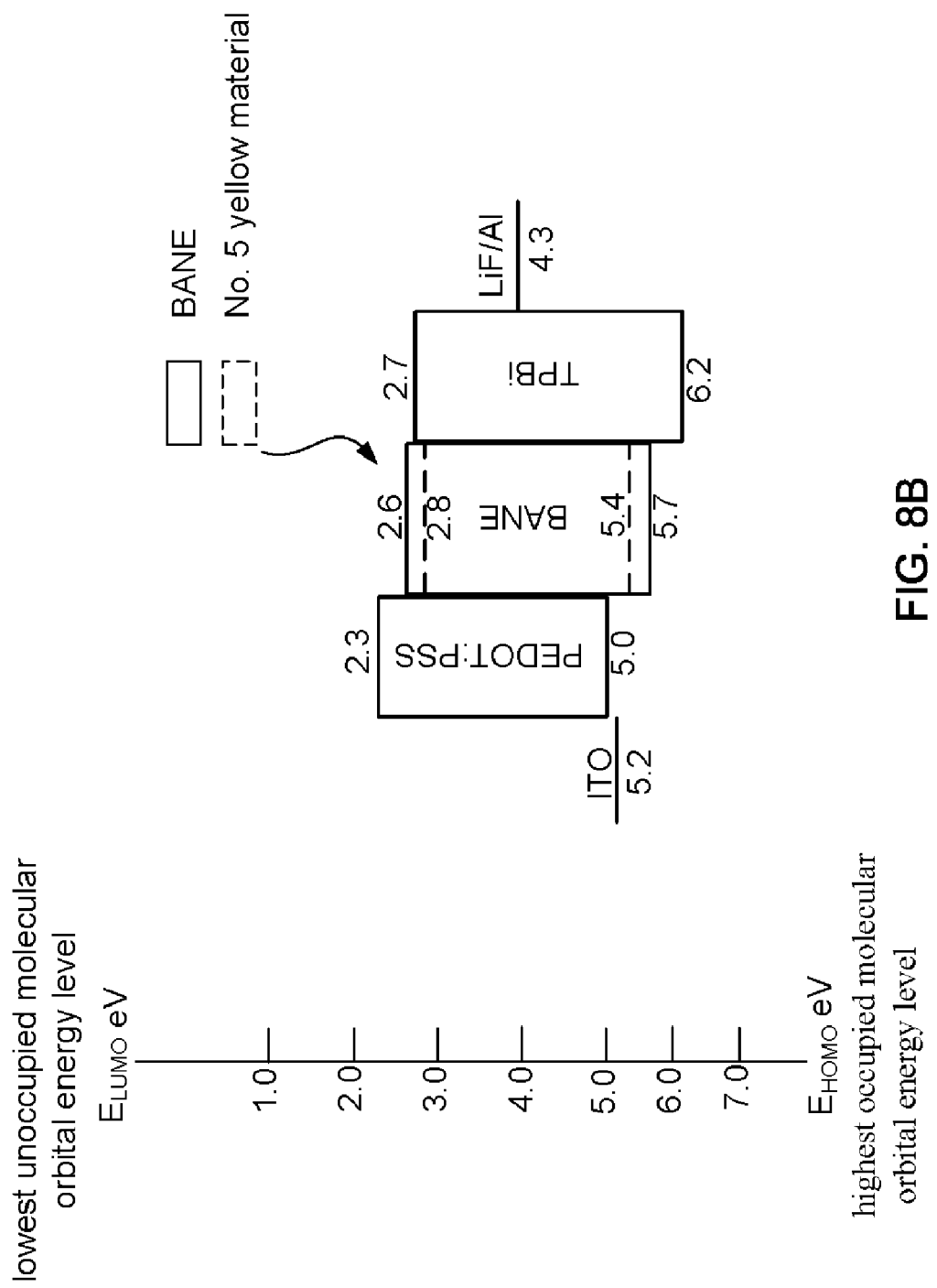
FIG. 8B is an energy level diagram of an organic light-emitting diode device respectively using BANE and No. 5 yellow material as a host light-emitting layer and a guest light-emitting material.
Figure 8C:
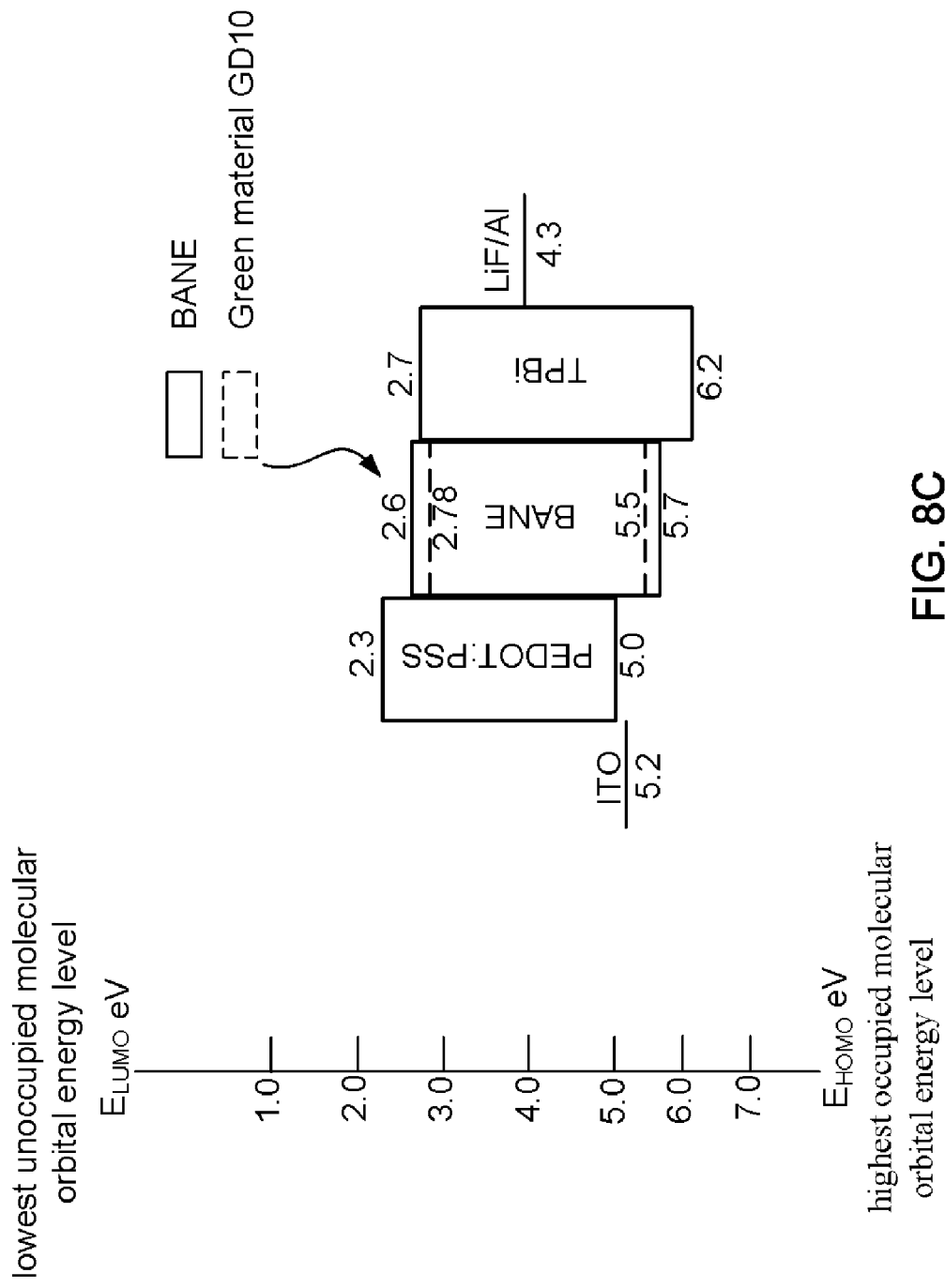
FIG. 8C is an energy level diagram of an organic light-emitting diode device respectively using BANE and green material GD10 as a host light-emitting layer and a guest light-emitting material.

Please refer to FIG. 8A, FIG. 8B and FIG. 8C, which illustrate the energy level diagrams of the organic light-emitting diode device respectively using BANE and No. 10 sky blue material as a host light-emitting layer and a guest light-emitting material, the organic light-emitting diode device respectively using BANE and No. 5 yellow material as a host light-emitting layer and a guest light-emitting material, and the organic light-emitting diode device respectively using BANE and green material GD10 as a host light-emitting layer and a guest light-emitting material. As shown in FIG. 5 and FIG. 8A, in the organic light-emitting diode device 1 using BANE and No. 10 sky blue material as a host light-emitting layer and a guest light-emitting material, the first conductive layer 11 is an Indium Tin Oxide (ITO), which has an energy level 5.2 eV and is used as an anode. The manufacturing material of the hole injection layer 12 is poly(3,4-ethylenedioxythiophene):poly-(styrenesulfonate) (PEDOT:PSS), and the highest occupied molecular orbital energy level and the lowest unoccupied molecular orbital energy level of the PEDOT:PSS are 5.0 eV and 2.3 eV, respectively. The manufacturing material of the host light-emitting layer 13 is BANE, and the highest occupied molecular orbital energy level and the lowest unoccupied molecular orbital energy level of the BANE are 5.2 eV and 2.1 eV. The manufacturing material of the guest light-emitting material 14 is 3,7-Bis(N, N-diphenylamino)-5,5-spirofluorenyl-5H-dibenzo[a,d]cycloheptene (No. 10 sky blue material), and the highest occupied molecular orbital energy level and the lowest unoccupied molecular orbital energy level of the No. 10 sky blue material are 5.0 eV and 2.1 eV. The manufacturing material of the electron transportation layer 15 is TPBi, and the highest occupied molecular orbital energy level and the lowest unoccupied molecular orbital energy level of the TPBi are 6.2 eV and 2.7 eV. Moreover, the electron injection layer 17 is Lithium Fluoride (LiF), and the second conductive layer 16 is an aluminum (Al) used as a cathode, wherein the effective energy level of the LiF and the Al is 4.3 eV.

As shown in FIG. 5 and FIG. 8B, in the organic light-emitting diode device 1 using the BANE and the No. 5 yellow material as a host light-emitting layer and a guest light-emitting material, the material of the guest light-emitting material 14 is the No. 5 yellow material, and the highest occupied molecular orbital energy level and the lowest unoccupied molecular orbital energy level of the No. 5 yellow material are 5.4 eV and 2.8 eV, respectively. In addition, the first conductive layer 11, the hole injection layer 12, the host light-emitting layer 13, the electron transportation layer 15, the electron injection layer 17, and the second conductive layer 16 are the ITO, the PEDOT:PSS, the BANE, the TPBi, the LiF and the Al, respectively.

Moreover, As shown in FIG. 5 and FIG. 8C, in the organic light-emitting diode device 1 using BANE and green material GD10 as a host light-emitting layer and a guest light-emitting material, the material of the guest light-emitting material 14 is bis[p-isopropylohenyl](p-tolyl)amino]-10-10'-phenanthracene (BPTAPA), which is called green material GD10, wherein the highest occupied molecular orbital energy level and the lowest unoccupied molecular orbital energy level of the green material GD10 are 5.5 eV and 2.78 eV, respectively. In addition, the first conductive layer 11, the hole injection layer 12, the host light-emitting layer 13, the electron transportation layer 15, the electron injection layer 17, and the second conductive layer 16 are the ITO, the PEDOT:PSS, the BANE, the TPBi, the LiF and the Al, respectively.

The three different organic light-emitting diode devices shown in FIG. 8A, FIG. 8B and FIG. 8C have the same first conductive layer 11 (i.e., the anode), hole injection layer 12, the host light-emitting layer 13, electron transportation layer 15, electron injection layer 17, and second conductive layer 16 (i.e., the cathode); However, the three different organic light-emitting diode devices have the different guest light-emitting material 14, which are the No. 10 sky blue material, the No. 5 yellow material and the green material GD10.

Figure 9:
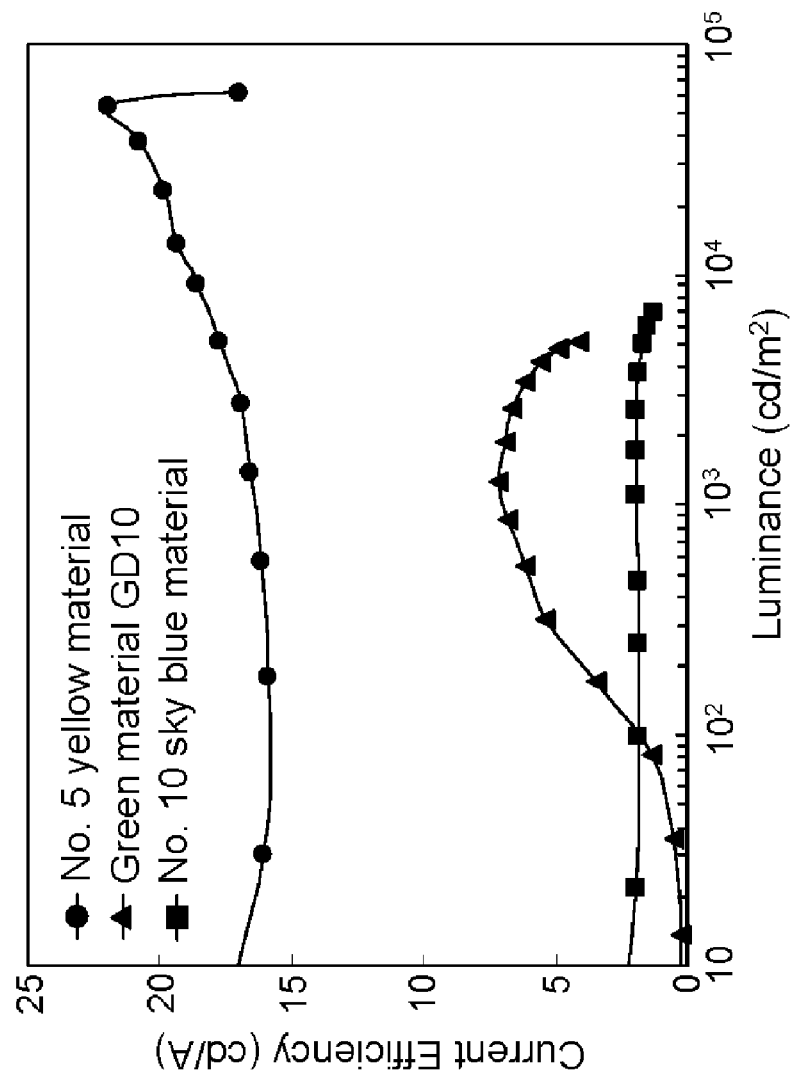
FIG. 9 is a curve diagram of the current efficiency of the three organic light-emitting diode devices.

Besides, please refer to FIG. 9, which illustrates a curve diagram of the current efficiency of the three organic light-emitting diode devices.

Through the curve shown in FIG. 9, it is able to know that, in the organic light-emitting diode device using the BANE and the No. 5 yellow material as the host light-emitting layer and the guest light-emitting material, since the highest occupied molecular orbital energy level and the lowest unoccupied molecular orbital energy level of the BANE are 5.7 eV and 2.6 eV and the highest occupied molecular orbital energy level and the lowest unoccupied molecular orbital energy level of the light-emitting material are 5.4 eV and 2.8 eV, the differential value of the host lowest unoccupied molecular orbital energy level ($E_{LUMO,host}$) and guest lowest unoccupied molecular orbital energy level ($E_{LUMO,guest}$), i.e., $\Delta E_{LUMO} = E_{LUMO,host} - E_{LUMO,guest} = 2.6 - 2.8 = -0.2$ eV; besides, $\Delta E_{HOMO} = E_{HOMO,host} - E_{HOMO,guest} = 5.7 - 5.4 = 0.3$ eV. Therefore, according to the calculated $\Delta E_{LUMO}$ and $\Delta E_{HOMO}$, it can further calculate the value of $||\Delta E_{HOMO}| - |\Delta E_{LUMO}||$ is 0.1 eV. Thus, as shown in FIG. 9, with the incensement of the luminance, the color light emitted by the organic light-emitting diode device using the BANE and the No. 5 yellow material as the host light-emitting layer and the guest light-emitting material shows the property of current efficiency roll-up.

Besides, in the organic light-emitting diode device using the BANE and the green material GD10 as the host light-emitting layer and the guest light-emitting material, since the highest occupied molecular orbital energy level and the lowest unoccupied molecular orbital energy level of the host light-emitting layer are 5.7 eV and 2.6 eV and the highest occupied molecular orbital energy level and the lowest unoccupied molecular orbital energy level of the light-emitting material are 5.5 eV and 2.78 eV, the differential value of the host lowest unoccupied molecular orbital energy level ($E_{LUMO,host}$) and guest lowest unoccupied molecular orbital energy level ($E_{LUMO,guest}$), i.e., $\Delta E_{LUMO} = E_{LUMO,host} - E_{LUMO,guest} = -0.18$ eV; besides, $\Delta E_{HOMO} = E_{HOMO,host} - E_{HOMO,guest} = 0.2$ eV. Therefore, according to the calculated $\Delta E_{LUMO}$ and $\Delta E_{HOMO}$, it can further calculate the value of $||\Delta E_{HOMO}| - |\Delta E_{LUMO}||$ is 0.02 eV, which is a number extremely approaching to zero. Thus, as shown in FIG. 9, with the incensement of the luminance, the color light emitted by the organic light-emitting diode device using the BANE and the green material GD10 as the host light-emitting layer and the guest light-emitting material shows the property of current efficiency roll-up.

Figure 10A:
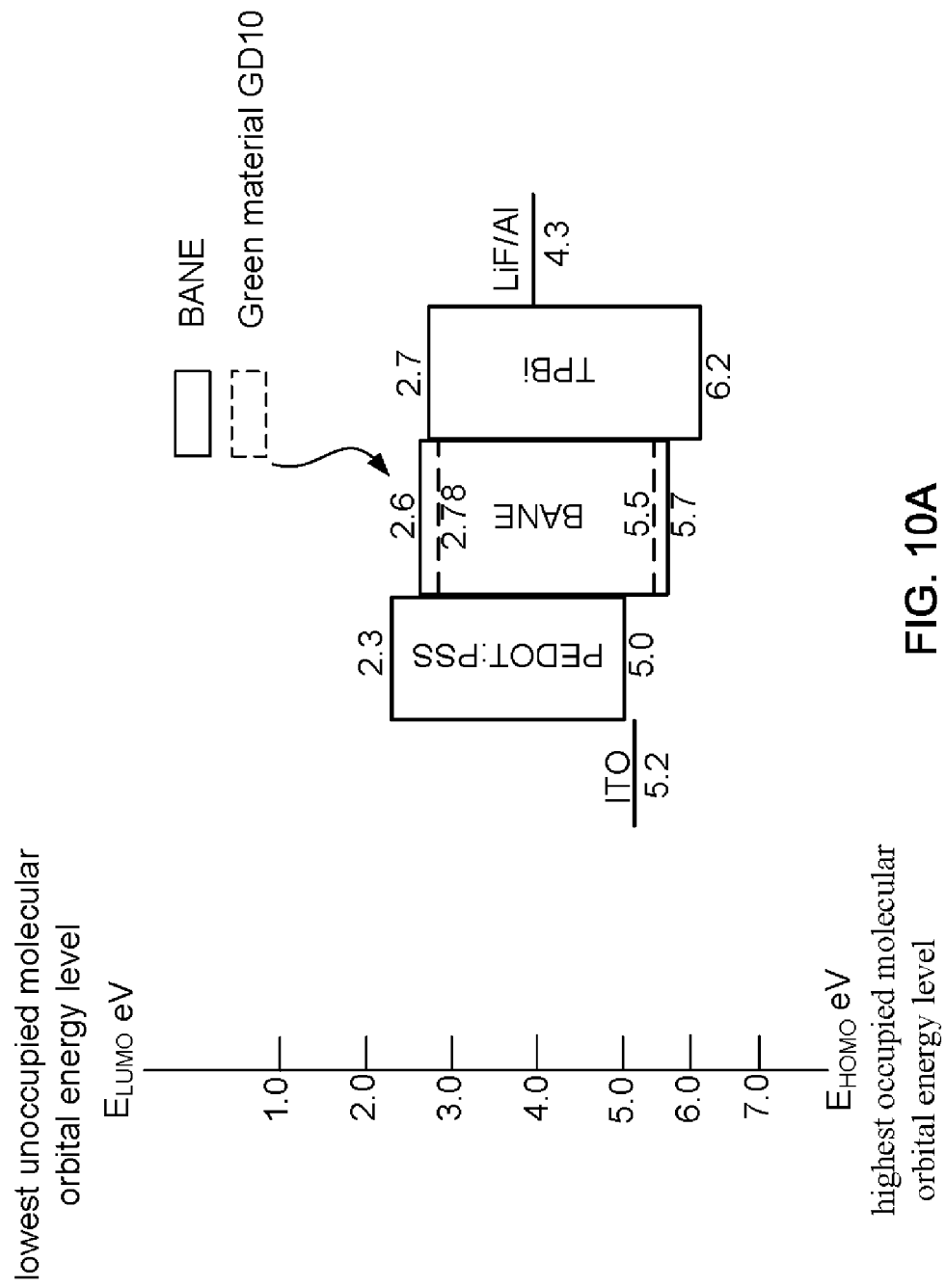
FIG. 10A is an energy level diagram of an organic light-emitting diode device respectively using BANE and green material GD10 as a host light-emitting layer and a guest light-emitting material.

For more clearly proving the characteristics and the effect, in follows, it will further describe and introduce that through others experiment data. Please refer to FIG. 10A and FIG. 10B, which illustrate the energy level diagrams of the organic light-emitting diode device respectively using BANE and green material GD10 as a host light-emitting layer and a guest light-emitting material and the organic light-emitting diode device respectively using DSB and green material GD10 as a host light-emitting layer and a guest light-emitting material. As shown in FIG. 5 and FIG. 10A, in the organic light-emitting diode device using the BANE and the green material GD10 as the host light-emitting layer and the guest light-emitting material, the guest light-emitting material 14 is the green material GD10, and the highest occupied molecular orbital energy level and the lowest unoccupied molecular orbital energy level of the green material GD10 are 5.5 eV and 2.78 eV, respectively. In addition, the first conductive layer 11, the hole injection layer 12, the host light-emitting layer 13, the electron transportation layer 15, the electron injection layer 17, and the second conductive layer 16 are the ITO, the PEDOT:PSS, the BANE, the TPBi, the LiF and the Al, respectively.

Figure 10B:
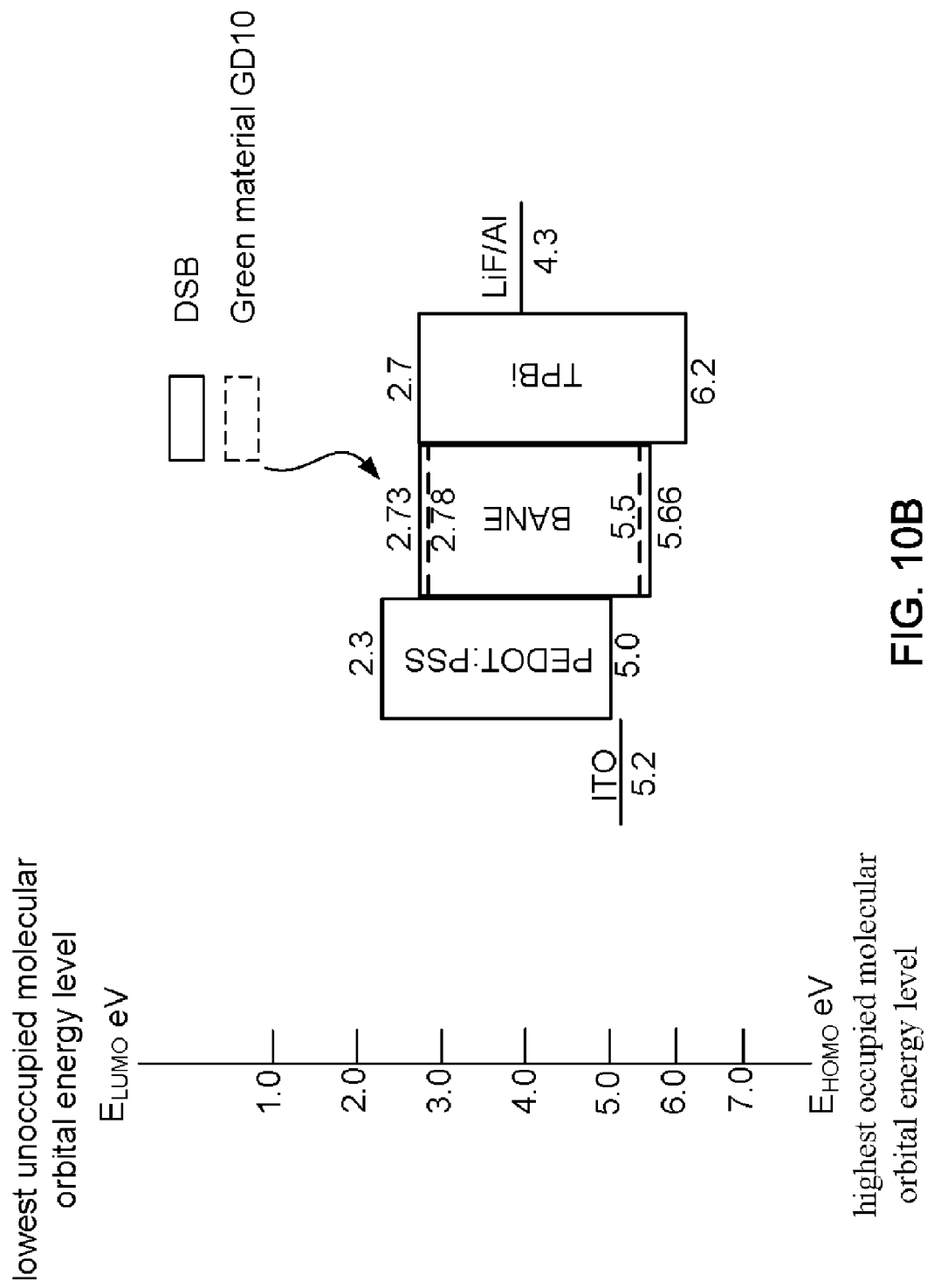
FIG. 10B is an energy level diagram of an organic light-emitting diode device respectively using DSB and green material GD10 as a host light-emitting layer and a guest light-emitting material.

Moreover, as shown in FIG. 5 and FIG. 10B, in the organic light-emitting diode device 1 using DSB and green material GD10 as a host light-emitting layer and a guest light-emitting material, the manufacturing material of the host light-emitting layer 13 is 1,4-bis[2-[4-[N,N-di(p-tolyl)amino]phenyl]vinyl]benzene (DSB), and the highest occupied molecular orbital energy level and the lowest unoccupied molecular orbital energy level of the DSB are 5.5 eV and 2.78 eV, respectively. In addition, the first conductive layer 11, the hole injection layer 12, the guest light-emitting material 13, the electron transportation layer 15, the electron injection layer 17, and the second conductive layer 16 are the ITO, the PEDOT:PSS, the green material GD10, the TPBi, the LiF and the Al, respectively.

The two different organic light-emitting diode devices shown in FIG. 10A and FIG. 10B have the same first conductive layer 11 (i.e., the anode), hole injection layer 12, the guest light-emitting material 14, electron transportation layer 15, electron injection layer 17, and second conductive layer 16 (i.e., the cathode); However, the two different organic light-emitting diode devices have the different host light-emitting layer 13, which are the BANE and the DSB. Besides, please refer to FIG. 11, which illustrates a curve diagram of the current efficiency of the two organic light-emitting diode devices.

Figure 11:
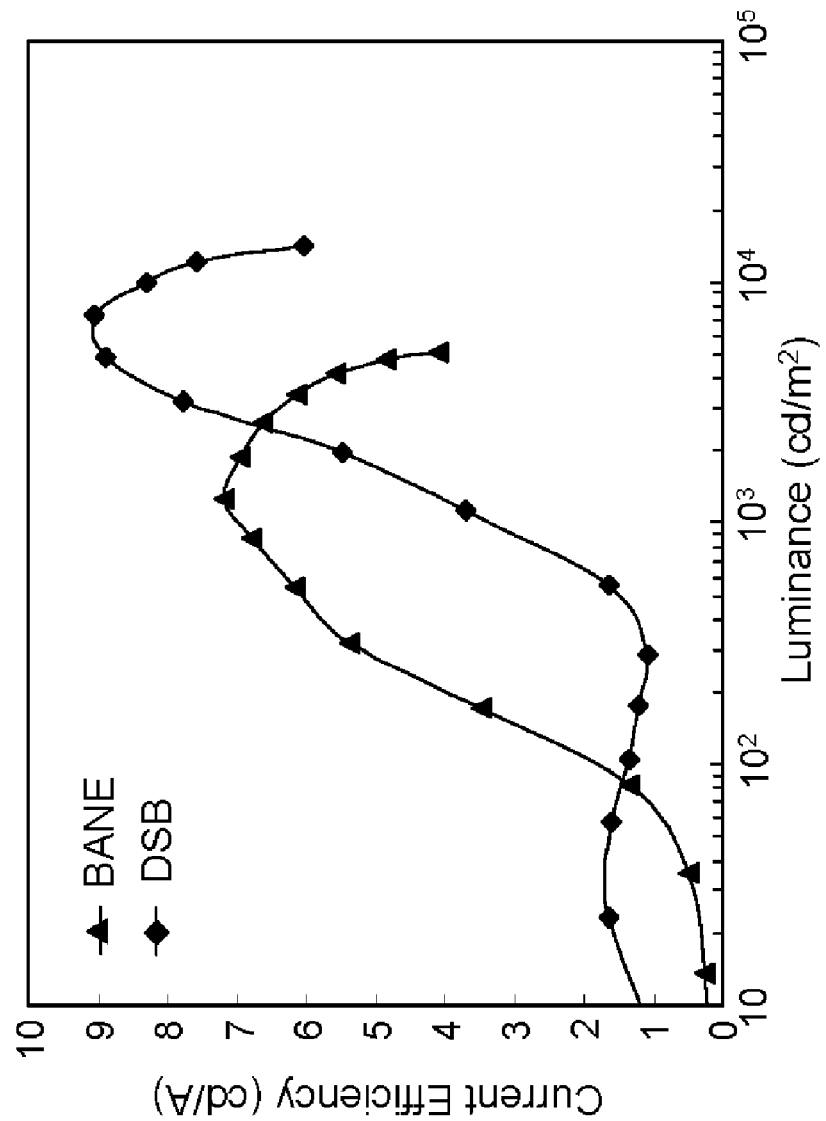
FIG. 11 is a curve diagram of the current efficiency of the two organic light-emitting diode devices.

Through the curve shown in FIG. 11, it is able to know that, in the organic light-emitting diode device using the BANE and the green material GD10 as the host light-emitting layer and the guest light-emitting material, since the highest occupied molecular orbital energy level and the lowest unoccupied molecular orbital energy level of the BANE are 5.7 eV and 2.6 eV and the highest occupied molecular orbital energy level and the lowest unoccupied molecular orbital energy level of the light-emitting material are 5.5 eV and 2.78 eV, the differential value of the host lowest unoccupied molecular orbital energy level ($E_{LUMO,host}$) and guest lowest unoccupied molecular orbital energy level ($E_{LUMO,guest}$), i.e., $\Delta E_{LUMO} = E_{LUMO,host} - E_{LUMO,guest} = -0.18$ eV; besides, $\Delta E_{HOMO} = E_{HOMO,host} - E_{HOMO,guest} = 0.2$ eV. Therefore, according to the calculated $\Delta E_{LUMO}$ and $\Delta E_{HOMO}$, it can further calculate the value of $\||\Delta E_{HOMO}| - |\Delta E_{LUMO}\|$ is 0.02 eV. Thus, as shown in FIG. 11, with the incensement of the luminance, the color light emitted by the organic light-emitting diode device using the BANE and the green material GD10 as the host light-emitting layer and the guest light-emitting material shows the property of current efficiency roll-up.

Besides, in the organic light-emitting diode device using the DSB and the green material GD10 as the host light-emitting layer and the guest light-emitting material, since the highest occupied molecular orbital energy level and the lowest unoccupied molecular orbital energy level of the host light-emitting layer are 5.66 eV and 2.73 eV and the highest occupied molecular orbital energy level and the lowest unoccupied molecular orbital energy level of the light-emitting material are 5.5 eV and 2.78 eV, the differential value of the host lowest unoccupied molecular orbital energy level ($E_{LUMO,host}$) and guest lowest unoccupied molecular orbital energy level ($E_{LUMO,guest}$), i.e., $\Delta E_{LUMO} = E_{LUMO,host} - E_{LUMO,guest} = -0.05$ eV; besides, $\Delta E_{HOMO} = E_{HOMO} = E_{HOMO,host} - E_{HOMO,guest} = 0.16$ eV. Therefore, according to the calculated $\Delta E_{LUMO}$ and $\Delta E_{HOMO}$, it can further calculate the value of $\||\Delta E_{HOMO}| - |\Delta E_{LUMO}\|$ is 0.11 eV. Thus, as shown in FIG. 11, with the incensement of the luminance, the color light emitted by the organic light-emitting diode device using the DSB and the green material GD10 as the host light-emitting layer and the guest light-emitting material shows the property of current efficiency roll-up.

So that, through the above-mentioned structural drawings, energy level diagrams and various experiment data, the organic light-emitting diode device with efficiency roll-up property has been introduced and disclosed. Moreover, the present invention further includes a second embodiment for introducing the organic light-emitting diode device with efficiency roll-up property. Please refer to FIG. 12, which illustrates a structural drawing of a second embodiment of the organic light-emitting diode device with efficiency roll-up property according to the present invention. As shown in FIG. 12, the second embodiment of the organic light-emitting diode device 1 with efficiency roll-up property includes: a first conductive layer 11, a hole injection layer 12, a hole transportation layer 18, a host light-emitting layer 13, a guest light-emitting material 14, an electron transportation layer 15, an electron injection layer 17, and a second conductive layer 16, wherein the first conductive layer 11, the hole injection layer 12, the host light-emitting layer 13, the guest light-emitting material 14, the electron transportation layer 15, the electron injection layer 17, and the second conductive layer 16 in the second embodiment of the organic light-emitting diode device 1 are the same to the first conductive layer 11, the hole injection layer 12, the host light-emitting layer 13, the guest light-emitting material 14, the electron transportation layer 15, the electron injection layer 17, and the second conductive layer 16 in the aforesaid embodiment of the organic light-emitting diode device 1.

In the second embodiment, the hole transportation layer 18 is formed between the hole injection layer 12 and the host light-emitting layer 13. Through the hole transportation layer 18, the number of holes moving into the host light-emitting layer 13 can be increased, besides, the hole transportation layer 18 can prevent the electrons in the host light-emitting layer 13 not recombining with the holes from flowing to the first conductive layer 11 (anode).

Thus, through the descriptions, the organic light-emitting diode device with efficiency roll-up property of the present invention has been completely introduced and disclosed; So that, in summary, the present invention has the following advantages:

In the present invention, it properly selects a guest light-emitting material and dopes the guest light-emitting material into a host light-emitting layer, so as to make the value of $\||\Delta E_{HOMO}| - |\Delta E_{LUMO}\|$ approach to zero, and then the color light emitted by the host light-emitting layer can show the property of current efficiency roll-up.

The above description is made on embodiments of the present invention. However, the embodiments are not intended to limit scope of the present invention, and all equivalent implementations or alterations within the spirit of the present invention still fall within the scope of the present invention.

What is claimed is:

1. An organic light-emitting diode device with efficiency roll-up property, comprising:
   a first conductive layer;
   a hole injection layer, being formed on the first conductive layer;
   a host light-emitting layer, being formed on the hole injection layer and having a host highest occupied molecular orbital energy level ($E_{HOMO,host}$) and a host lowest unoccupied molecular orbital energy level ($E_{LUMO,host}$);

a guest light-emitting material, being properly selected and doped in the host light-emitting layer, wherein the guest light-emitting material has a guest highest occupied molecular orbital energy level ($E_{HOMO,guest}$) and a guest lowest unoccupied molecular orbital energy level ($E_{LUMO,guest}$);

an electron transportation layer, being formed on the host light-emitting layer;

an electron injection layer, being formed on the electron transportation layer; and a second conductive layer, being formed on the electron injection layer;

wherein when a forward bias is applied to the first conductive layer and the second conductive layer, a plurality of holes may be injected into the hole injection layer from the first conductive layer, and a plurality of electrons may be injected into the electron injection layer from the second conductive layer, moreover, a potential difference produced by the forward bias making the electrons and the holes to move, and the moving electrons and the moving holes may recombine in the host light-emitting layer, such that the host light-emitting layer emits a color light;

wherein when the selected guest light-emitting material is doped in the host light-emitting layer and makes the value of $\|\Delta E_{HOMO}|-|\Delta E_{HOMO}\|$ approach to zero, the color light emitted by the host light-emitting layer showing the property of current efficiency roll-up;

wherein the $\Delta E_{HOMO}$ is defined as the differential value of the host highest occupied molecular orbital energy level ($E_{HOMO,host}$) and guest highest occupied molecular orbital energy level ($E_{HOMO,guest}$) and the $\Delta E_{LUMO}$ is defined as the differential value of the host lowest unoccupied molecular orbital energy level ($E_{LUMO,host}$) and the guest lowest unoccupied molecular orbital energy level ($E_{LUMO,guest}$).

2. The organic light-emitting diode device with efficiency roll-up property of claim 1, wherein the first conductive layer is an Indium Tin Oxide (ITO), used as an anode.

3. The organic light-emitting diode device with efficiency roll-up property of claim 1, wherein the manufacturing material of the second conductive layer is an aluminum, which is used as a cathode.

4. The organic light-emitting diode device with efficiency roll-up property of claim 1, wherein the manufacturing material of the hole injection layer is poly(3,4-ethylene-dioxythiophene):poly-(styrenesulfonate) (PEDOT:PSS).

5. The organic light-emitting diode device with efficiency roll-up property of claim 1, wherein the manufacturing material of the electron transportation layer is 1,3,5-tris(N-phenyl-benzimidazol-2-yl)benzene (TPBi).

6. The organic light-emitting diode device with efficiency roll-up property of claim 1, wherein the manufacturing material of the host light-emitting layer is selected from the group consisting of: 2-(N,N-diphenyl-amino)-6-[4-(N,N-diphenylamine)styryl]naphthalene (DPASN), 2,7-bis{2[phenyl(m-tolyl)amino]-9,9-dimethyl-fluorene-7-yl}-9,9-dimethyl-fluorene (MDP3FL), 1-butyl-9,10-naphthalene-anthracene (BANE), and 1,4-bis[2-[4-[N,N-di(p-tolyl)amino]phenyl]vinyl]benzene (DSB).

7. The organic light-emitting diode device with efficiency roll-up property of claim 1, wherein the guest light-emitting material is selected from the group consisting of: 3,7-Bis(N,N-diphenylamino)-5,5-spirofluorenyl-5H-dibenzo[a,d]cycloheptene), Spiro-fluorene-dibenzosuberene[d](1,4-bis(4-(N,N-diphenylamine)-phenyl)-quinoxaline), and bis[p-isopropylohenyl](p-tolyl)amino]-10-10'-phenanthracene).

8. The organic light-emitting diode device with efficiency roll-up property of claim 1, wherein the guest light-emitting material is a dye dopant, used for changing the color of the color light emitted by the host light-emitting layer.

9. The organic light-emitting diode device with efficiency roll-up property of claim 3, wherein the manufacturing material of the electron injection layer is Lithium Fluoride (LiF).

10. The organic light-emitting diode device with efficiency roll-up property of claim 1, further comprising a hole transportation layer and the manufacturing material of the hole transportation layer is 1,1-bis{4-[di(p-tolyl)amino]-phenyl}cyclohexane (TAPC).

* * * * *